US009209028B2

(12) United States Patent
Xu et al.

(10) Patent No.: US 9,209,028 B2
(45) Date of Patent: Dec. 8, 2015

(54) ION IMPLANTATION METHODS

(71) Applicant: Rohm and Haas Electronic Materials LLC, Marlborough, MA (US)

(72) Inventors: Cheng-Bai Xu, Southborough, MA (US); Cheng Han Wu, Marlborough, MA (US); Dong Won Chung, Gyeonggi-Do (KR); Yoshihiro Yamamoto, Niigata (JP); George G. Barclay, Chaska, MN (US); Gerhard Pohlers, Needham, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/145,674

(22) Filed: Dec. 31, 2013

(65) Prior Publication Data
US 2015/0214056 A1 Jul. 30, 2015

Related U.S. Application Data

(60) Provisional application No. 61/748,047, filed on Dec. 31, 2012.

(51) Int. Cl.
*H01L 21/266* (2006.01)
*H01L 21/02* (2006.01)
*H01L 21/3105* (2006.01)

(52) U.S. Cl.
CPC .......... *H01L 21/266* (2013.01); *H01L 21/0206* (2013.01); *H01L 21/02118* (2013.01); *H01L 21/31058* (2013.01)

(58) Field of Classification Search
CPC .............. H01L 21/0273; H01L 21/266; H01L 2224/11; H01L 24/11; H01L 21/0206; H01L 21/02118; H01L 21/31058

USPC .......................................... 438/350, 400, 514
See application file for complete search history.

(56) References Cited

U.S. PATENT DOCUMENTS 6,180,320 B1  1/2001  Saito et al.
6,274,289 B1  8/2001  Subramanian et al.
(Continued)

FOREIGN PATENT DOCUMENTS

JP   2002006512 A    1/2002
JP   2002299202 A   10/2002
JP      4329216 B2    9/2009

OTHER PUBLICATIONS

Search Report for corresponding Taiwan Application No. 102148977 dated Jun. 24, 2015.

*Primary Examiner* — Caleen Sullivan
(74) *Attorney, Agent, or Firm* — Jonathan D. Baskin

(57) ABSTRACT

Provided are methods of forming an ion implanted region in a semiconductor device. The methods comprise: (a) providing a semiconductor substrate having a plurality of regions to be ion implanted; (b) forming a photoresist pattern on the semiconductor substrate, wherein the photoresist pattern is formed from a chemically amplified photoresist composition comprising a matrix polymer having acid labile groups, a photoacid generator and a solvent; (c) coating a descumming composition over the photoresist pattern, wherein the descumming composition comprises: a matrix polymer; an acid generator chosen from thermal acid generators, photoacid generators and combinations thereof; and a solvent; (d) exposing the coated semiconductor substrate to conditions to generate an acid in the descumming composition from the acid generator; (e) contacting the coated semiconductor substrate with a rinsing agent to remove residual descumming composition and scum from the substrate; and (f) ion implanting the plurality of regions of the semiconductor substrate using the photoresist pattern as an implant mask. The methods find particular applicability in the manufacture of semiconductor devices.

13 Claims, 1 Drawing Sheet

(56) References Cited

U.S. PATENT DOCUMENTS

| | | |
|---|---|---|
| 6,372,829 B1 | 4/2002 | Lamanna et al. |
| 6,492,075 B1 | 12/2002 | Templeton et al. |
| 7,338,750 B2 | 3/2008 | Kozawa et al. |
| 7,862,982 B2 | 1/2011 | Burns et al. |
| 8,067,148 B2 | 11/2011 | Endou et al. |
| 2006/0263728 A1 | 11/2006 | Shinbori et al. |
| 2007/0152305 A1* | 7/2007 | Kim ................................ 257/635 |
| 2010/0048443 A1 | 2/2010 | Ohwada |
| 2011/0256481 A1 | 10/2011 | Pohlers |
| 2012/0028434 A1* | 2/2012 | Lee et al. .................... 438/400 |
| 2012/0264053 A1 | 10/2012 | Wang |
| 2014/0186772 A1 | 7/2014 | Pohlers et al. |
| 2014/0187027 A1 | 7/2014 | Xu et al. |

\* cited by examiner

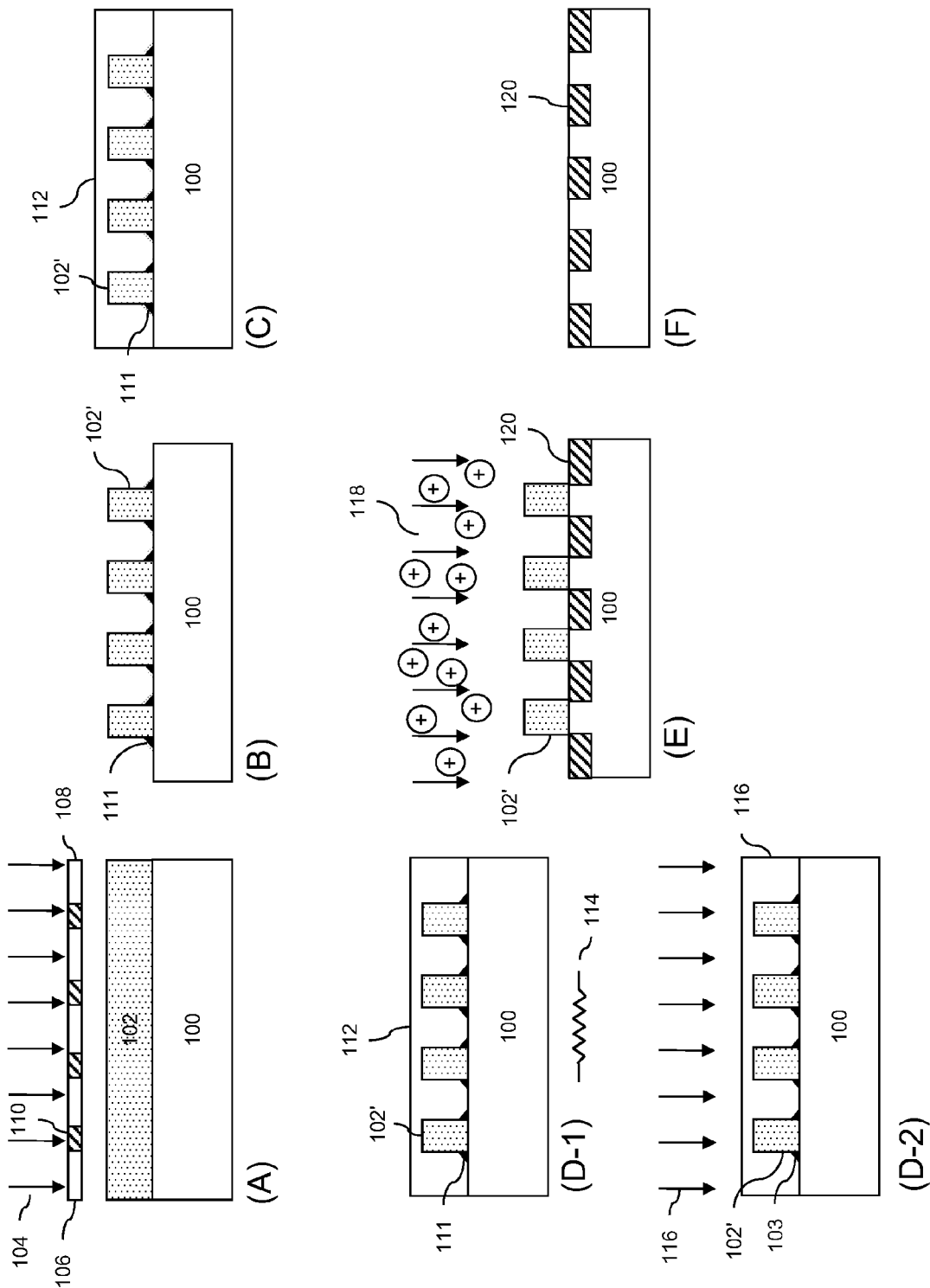

ION IMPLANTATION METHODS

This application claims the benefit of priority under 35 U.S.C. §119(e) to U.S. Provisional Application No. 61/748,047, filed Dec. 31, 2012, the entire contents of which application are incorporated herein by reference.

BACKGROUND

The invention relates generally to the manufacture of electronic devices. More specifically, this invention relates to methods of forming ion implanted regions in a semiconductor device.

In the semiconductor manufacturing industry, ion implantation is conventionally used for introducing impurities (or dopants) of a desired conductivity into semiconductor substrates such as silicon wafers. Commonly used impurities include boron (p-type), arsenic (n-type) and phosphorus (n-type). When implanted into a semiconductor, the dopant atoms create charge carriers after annealing. Holes are created for p-type dopants and electrons for n-type dopants, thereby allowing for modification of conductivity of the semiconductor material. The process is thereby used to form and impart desired characteristics to electronic devices such as MOSFETs.

The ion implantation process involves generation of an ion beam containing the dopant in ionized form from a source, typically in gas or solid form, which is directed to the semiconductor substrate surface. To selectively introduce the impurity atoms into predefined regions of the substrate, a photoresist mask is typically formed over the substrate surface prior to ion implantation. The mask is formed by coating the substrate with a photoresist layer which is then exposed to activating radiation through a patterned photomask and developed to form a resist pattern. The resist pattern includes openings exposing the underlying substrate, the openings corresponding to regions of the semiconductor substrate to be implanted and regions of the substrate underlying the resist mask being protected from implantation. Following implantation, the resist mask is stripped from the substrate and the substrate is annealed.

As photolithography technology approaches its resolution limits, the printing of fine geometries on the substrate surface is a challenge. As a result of the extremely fine geometries required in the current generation of semiconductor devices, even small variations in the ion implantation process can adversely affect electrical properties of the formed devices. One factor detrimental to the ion implantation process is the presence of photoresist residue (scum) on regions of the substrate to be implanted following patterning of the implant mask. The presence of such resist scum can drastically impact device yield.

US 2011/10174774 A1 discloses a method of descumming a patterned photoresist. The method includes providing a material layer to be etched covered by a patterned photoresist, performing a descumming process with a nitrogen plasma to trim the edge of the patterned photoresist, and etching the material layer using the descumming patterned photoresist as a mask. The use of a plasma descumming process such as described in this document is undesirable for use with an ion implantation mask, for example, because of the complexity of the plasma etching process and plasma-induced damage to the underlying surface.

There is a continuing need in the art for improved ion implantation and photolithographic methods which minimize or avoid problems associated with the state of the art.

SUMMARY OF THE INVENTION

In accordance with a first aspect of the invention, methods of forming an ion implanted region in a semiconductor device are provided. The methods comprise: (a) providing a semiconductor substrate having a plurality of regions to be ion implanted; (b) forming a photoresist pattern on the semiconductor substrate, wherein the photoresist pattern is formed from a chemically amplified photoresist composition comprising a matrix polymer having acid labile groups, a photoacid generator and a solvent; (c) coating a descumming composition over the photoresist pattern, wherein the descumming composition comprises: a matrix polymer; an acid generator chosen from thermal acid generators, photoacid generators and combinations thereof; and a solvent; (d) exposing the coated semiconductor substrate to conditions to generate an acid in the descumming composition from the acid generator; (e) contacting the coated semiconductor substrate with a rinsing agent to remove residual descumming composition and scum from the substrate; and (f) ion implanting the plurality of regions of the semiconductor substrate using the photoresist pattern as an implant mask. In accordance with a further aspect of the invention, provided are electronic devices formed by the methods described herein.

DESCRIPTION OF THE DRAWINGS

The present invention will be described with reference to the following drawing, in which like reference numerals denote like features, and in which:

FIG. 1A-F illustrates a process flow for forming an ion implanted region in a semiconductor device in accordance with the invention.

DETAILED DESCRIPTION

Photoresist descumming compositions useful in the methods of the invention include a matrix polymer, an acid generator chosen from thermal acid generators, photoacid generators and combinations thereof, and a solvent, and can include optional additional components. When coated over a semiconductor substrate having a photoresist implant mask, the descumming compositions can advantageously minimize or eliminate the presence of scum on the surface of the pre-ion implanted substrate. As a result, ion implantion dopant profiles are not adversely impacted allowing for the formation of devices having desired electrical properties.

The matrix polymer allows for the compositions to be coated over the photoresist pattern in the form of a layer having a desired thickness. This will help to ensure the presence of a sufficient content of acid generator for interaction with scum on the photoresist patterned surface. The matrix polymer should have good solubility in the descumming composition rinsing agent used in the process. For example, the matrix polymer can be soluble in an aqueous alkaline rinsing agent, preferably aqueous quaternary ammonium hydroxide solutions such as aqueous tetramethylammonium hydroxide, or in water. To minimize residue defects originated from the descumming materials, the dissolution rate of a dried layer of the descumming composition should be greater than that of the photoresist pattern in the descumming composition rinsing agent. The matrix polymer typically exhibits a dissolution rate of 100 Å/second or higher in the rinsing agent, preferably 1000 Å/second or higher. The matrix polymer is soluble in the solvent of the descumming composition. The matrix polymer can be chosen, for example, from polyvinyl alcohols, polyacrylic acids, polyvinyl pyrrolidones, polyvinyl amines, polyvinyl acetals, poly(meth)acrylic acid and combinations thereof. Preferably, the polymer contains one or more functional group chosen from, —COOH, —SO$_3$H, SiOH, hydroxyl styrene, hydroxyl naphthalene, sulfonamide, hexafluoroisopropyl alcohol, anhydrates, lactones, esters, ethers, malamide, allylamine, pyrolidones and combinations thereof.

The content of the matrix polymer in the descumming composition will depend, for example, on the target thickness of the layer, with a higher polymer content being used for thicker layers. The matrix polymer is typically present in the descumming compositions in an amount of from 80 to 99 wt %, more typically from 90 to 99 wt %, based on total solids of the descumming composition. The weight average molecular weight of the polymer is typically less than 400,000, preferably from 2000 to 50,000, more preferably from 3000 to 10,000.

Polymers useful in the descumming compositions can be homopolymers or can be copolymers having a plurality of distinct repeat units, for example, two, three or four distinct repeat units. The descumming compositions include one or more polymer. Suitable polymers and monomers for use in the descumming compositions are commercially available and/or can readily be made by persons skilled in the art.

The descumming compositions further include one or more acid generator chosen from thermal acid generators (TAGs), photoacid generators (PAGs) and combinations thereof. The TAG generates an acid upon heating of the descumming composition to (or exceeding) a temperature characteristic of the particular TAG. The PAG generates an acid upon exposure of the composition to activating radiation for the particular PAG, for example, light having a particular wavelength (e.g., 365 nm, 248 nm, 193 nm or EUV wavelength (e.g., 13.5 nm) or electron beam (E-beam) radiation. Where a PAG is present in the descumming composition, care should be taken to use an exposure radiation that will not adversely impact the underlying photoresist pattern. For example, where the underlying photoresist pattern is formed from a positive tone material, the descumming composition exposure radiation should be chosen so as not to cause deprotection of the pattern's resist material. Typically, the composition includes a TAG without PAGs, as acid generation by heating can be performed in a simpler manner than by exposure to activating radiation. Preferably, the generated acid from the TAG or PAG is a strong acid such as sulfonic acid, and can be aromatic or non-aromatic. The generated acids are optionally fluorinated. For example, TAGs and PAGs having at least one fluorine substituent at the alpha position of the acid for non-aromatic structures can be used. The content of the TAG and/or PAG in the composition is typically from 0.1 to 20 wt % based on the total solids of the descumming composition.

Suitable TAGs can be activated at a temperature greater than 50° C., for example, greater than 70° C., greater than 90° C., greater than 120° C. or greater than 150° C. Examples of suitable thermal acid generators include nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, trifluoromethylbenzenesulfonic acid, perfluorobutane sulfonic acid; and particular onium salts. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Examples of TAGs include those sold by King Industries, Norwalk, Conn. USA under NACURE™, CDX™ and K-PURE™ names, for example, NACURE 5225, CDX-2168E, K-PURE™ 2678 and K-PURE™ 2700. One or more of such TAGs can be used.

Suitable PAGs for use in the descumming compositions are known in the art of chemically amplified photoresists and include, for example: onium salts, for example, triphenylsulfonium trifluoromethanesulfonate, (p-tert-butoxyphenyl) diphenylsulfonium trifluoromethanesulfonate, tris(p-tert-butoxyphenyl)sulfonium trifluoromethanesulfonate, triphenylsulfonium p-toluenesulfonate, nitrobenzyl derivatives, for example, 2-nitrobenzyl p-toluenesulfonate, 2,6-dinitrobenzyl p-toluenesulfonate, and 2,4-dinitrobenzyl p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenensulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Preferable thermal acid generators and photoacid generators for use in the descumming compositions include aliphatic and aromatic structures and generate sulfonic acids. Aromatic TAGs and PAGs preferably comprise a phenyl, biphenyl, naphthyl, anthracenyl, thiophene or furan group. Suitable TAGs and PAGs include those of the following formulae (I) to (VII):

$$R^0ASO_3^- M^+ \quad (I)$$

wherein: $R^0$ is a linear, branched or cyclic alkyl group having from 1 to 30 carbon atoms, preferably from 1 to 15 carbon atoms, optionally substituted, for example, with a fluorine atom or hydroxy group; A is a single bond, an ether group, a thioether group, a carbonyl group, an ester group, an amido group, a sulfonamido group, a urethane group, a urea group, an alkylene group optionally substituted, for example, with a fluorine atom or hydroxy group, or a combination thereof; and $M^+$ is an organic or inorganic cation;

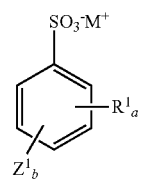

(II)

wherein: $R^1$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^1$ independently represents a group chosen from carboxyl, hydroxy, nitro, cyano, C1 to C5 alkoxy, formyl and sulfonic acid; a and b are independently an integer from 0 to 5; a+b is 5 or less; and $M^+$ is an organic or inorganic cation;

(III)

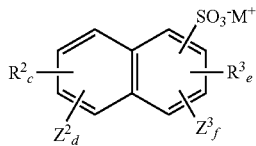

wherein: $R^2$ and $R^3$ each independently represents a substituted or unsubstituted C1-C20 alkyl group, a substituted or unsubstituted C5-C16 aryl group or a combination thereof, optionally containing one or more group chosen from carbonyl, carbonyloxy, sulfonamido, ether, thioether, a substituted or unsubstituted alkylene group, or a combination thereof; $Z^2$ and $Z^3$ each independently represents a group chosen from carboxyl, hydroxy, nitro, cyano, C1 to C5 alkoxy, formyl and sulfonic acid; c and d are independently an integer from 0 to 4; c+d is 4 or less; e and f are independently an integer from 0 to 3; e+f is 3 or less; and $M^+$ is an organic or inorganic cation;

(IV)

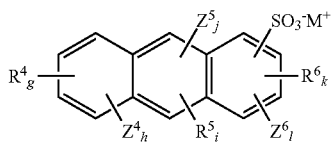

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 2; i+j is 2 or less; k and l are independently an integer from 0 to 3; k+l is 3 or less; and $M^+$ is an organic or inorganic cation;

(V)

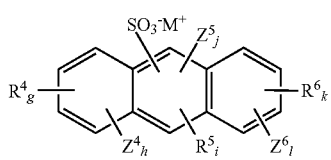

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 1; i+j is 1 or less; k and l are independently an integer from 0 to 4; k+l is 4 or less; and $M^+$ is an organic or inorganic cation;

(VI)

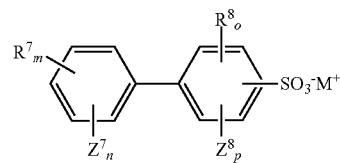

wherein: $R^7$ and $R^8$ each independently represents a substituted or unsubstituted C1-C20 alkyl group, a substituted or unsubstituted C5-C14 aryl group or a combination thereof, optionally containing one or more group chosen from carbonyl, carbonyloxy, sulfonamido, ether, thioether, a substituted or unsubstituted alkylene group, or a combination thereof; $Z^7$ and $Z^8$ each independently represents a group chosen from carboxyl, hydroxy, nitro, cyano, C1 to C5 alkoxy, formyl and sulfonic acid; m and n are independently an integer from 0 to 5; m+n is 5 or less; o and p are independently an integer from 0 to 4; o+p is 4 or less; and $M^+$ is an organic or inorganic cation; and (VII)

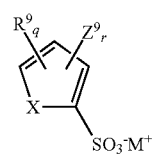

wherein: X is O or S; $R^9$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^9$ independently represents a group chosen from carboxyl, hydroxy, nitro, cyano, C1 to C5 alkoxy, formyl and sulfonic acid; q and r are independently an integer from 0 to 3; q+r is 3 or less; and $M^+$ is an organic or inorganic cation. For the foregoing structures, it should be clear that the $R^1$-$R^9$ groups can optionally form a fused structure together with their respective associated rings.

The organic cation $M^+$ is preferably chosen from cations of the following general formulae IV-VIII:

(IV)

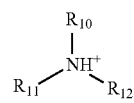

wherein $R_{10}$, $R_{11}$ and $R_{12}$ are each independently chosen from hydrogen and optionally substituted organic groups such as alkyl and phenyl, preferably optionally fluorinated C1 to C5 alkyl, two of $R_{10}$, $R_{11}$ and $R_{12}$ together optionally forming a ring, for example, cycloalkyl or aromatic, and one or more carbon atom being optionally substituted with a heteroatom, for example, oxygen or sulfur, preferable such cations including, for example, $NH_4+$, $CF_3CH_2NH_3+$, $(CH_3)_3NH+$, $(C_2H_5)_3NH+$ and $(CH_3)_2(C_2H_5)NH+$;

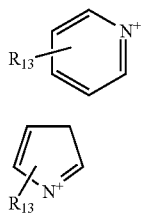
(V-1)

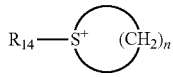
(V-2)

wherein: $R_{13}$ is chosen from hydrogen, fluorine and optionally substituted organic groups such as alkyl and aryl, preferably optionally fluorinated C1 to C5 alkyl or phenyl, and one or more ring carbon atom being optionally substituted with a heteroatom, for example, oxygen or sulfur;

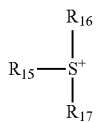
(VI)

wherein: $R_{14}$ is chosen from hydrogen and optionally substituted organic groups such as alkyl and aryl, preferably optionally fluorinated C1 to C5 alkyl or phenyl, and one or more carbon atom being optionally substituted with a heteroatom, for example, oxygen or sulfur; and n is an integer of from 3 to 12, preferably 5 or 6;

$$R_{15}\!-\!\underset{\underset{R_{17}}{|}}{\overset{\overset{R_{16}}{|}}{S^+}}$$
(VII)

wherein: $R_{15}$, $R_{16}$ and $R_{17}$ are each independently chosen from hydrogen and optionally substituted organic groups such as alkyl and aryl, preferably optionally fluorinated C1 to C5 alkyl or phenyl with optional acid labile group, two or more of $R_{15}$, $R_{16}$ and $R_{17}$ together optionally forming a ring, for example, cycloalkyl or aromatic, and one or more carbon atom being optionally substituted with a heteroatom, for example, oxygen or sulfur; and

(VIII)

wherein: $R_{18}$ and $R_{19}$ are each independently chosen from hydrogen and optionally substituted organic groups such as alkyl and aryl, preferably optionally fluorinated C1 to C5 alkyl or phenyl with optional acid labile group, $R_{18}$ and $R_{19}$ together optionally forming a ring, for example, cycloalkyl or aromatic, and one or more carbon atom being optionally substituted with a heteroatom, for example, oxygen or sulfur.

Exemplary TAGs and PAGs for use in the present invention include, for example, those of the following formulae: $CF_3SO_3^-M^+$, $C_4F_9SO_3^-M^+$, $CH_3CH_2CF_2CF_2SO_3^-M^+$, $HOCH_2CH_2CF_2CF_2SO_3^-M^+$,

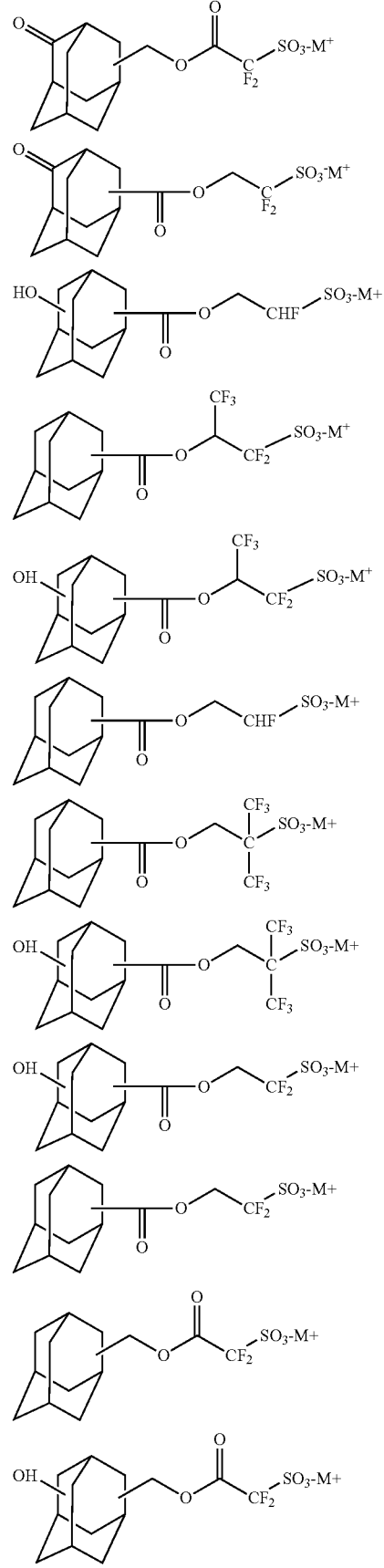

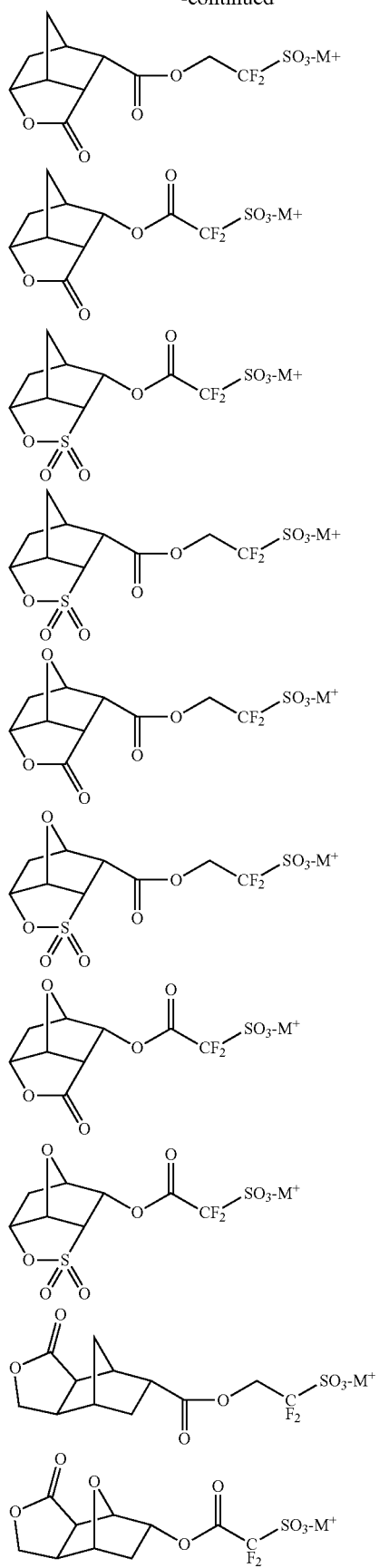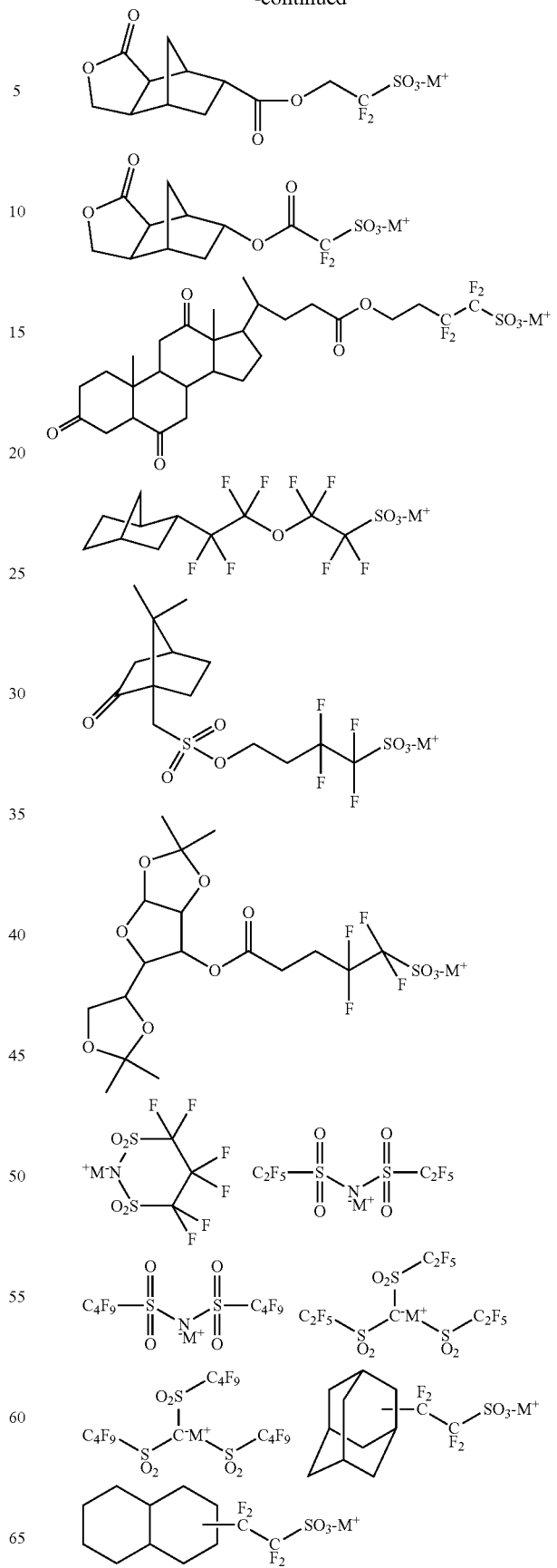

-continued
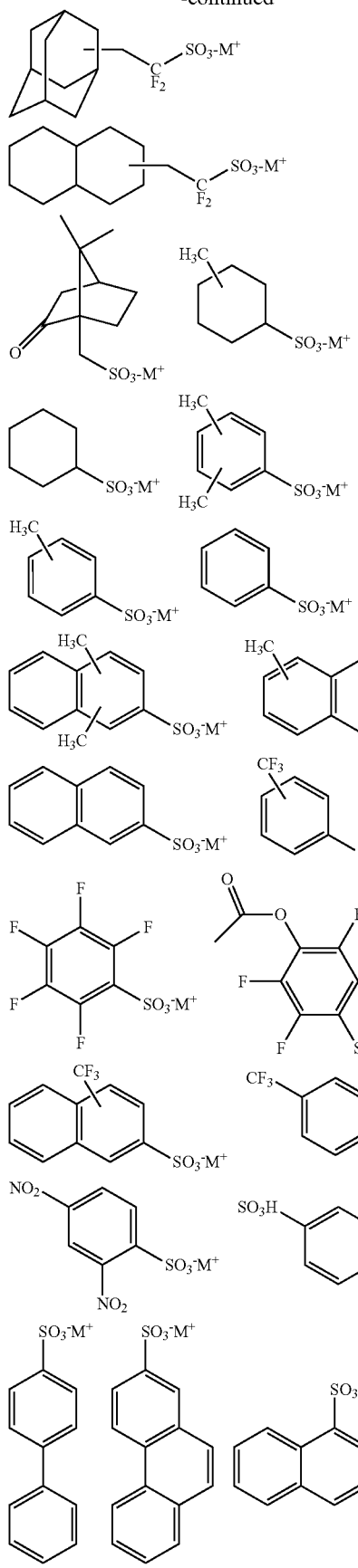
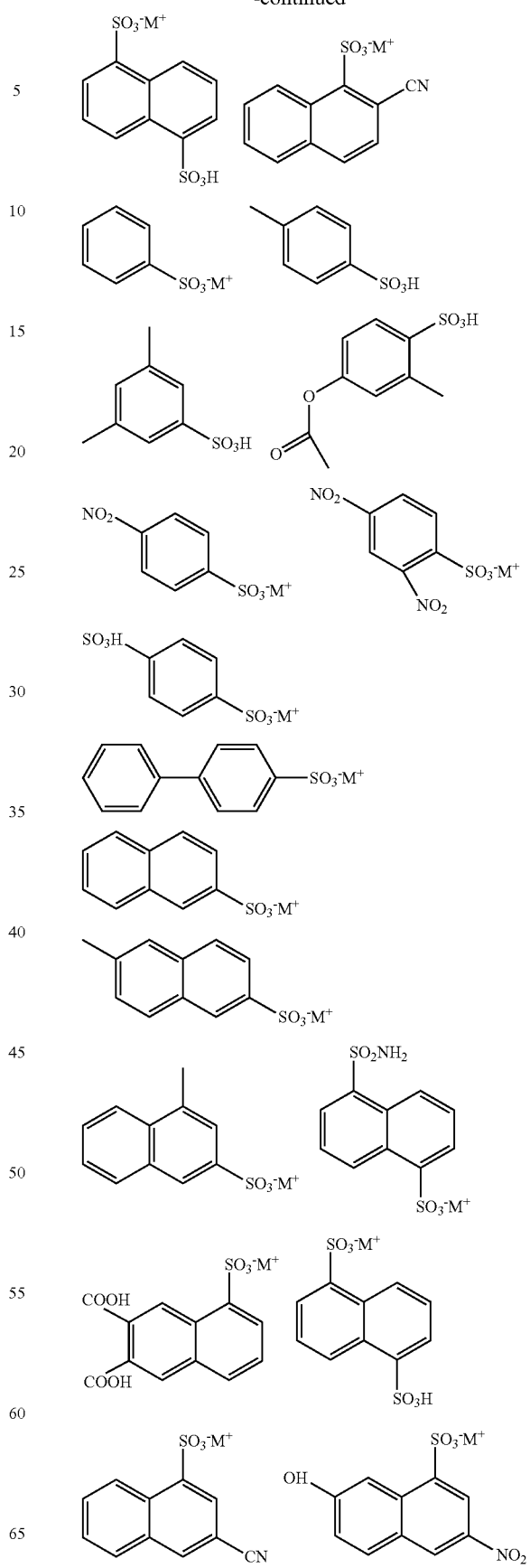

-continued
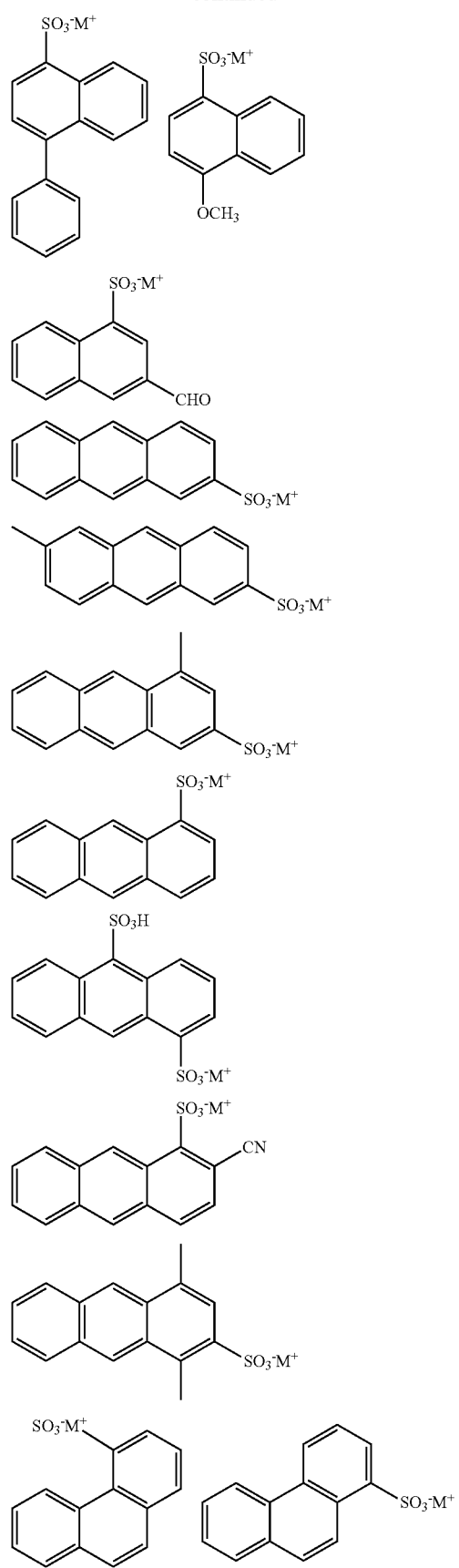
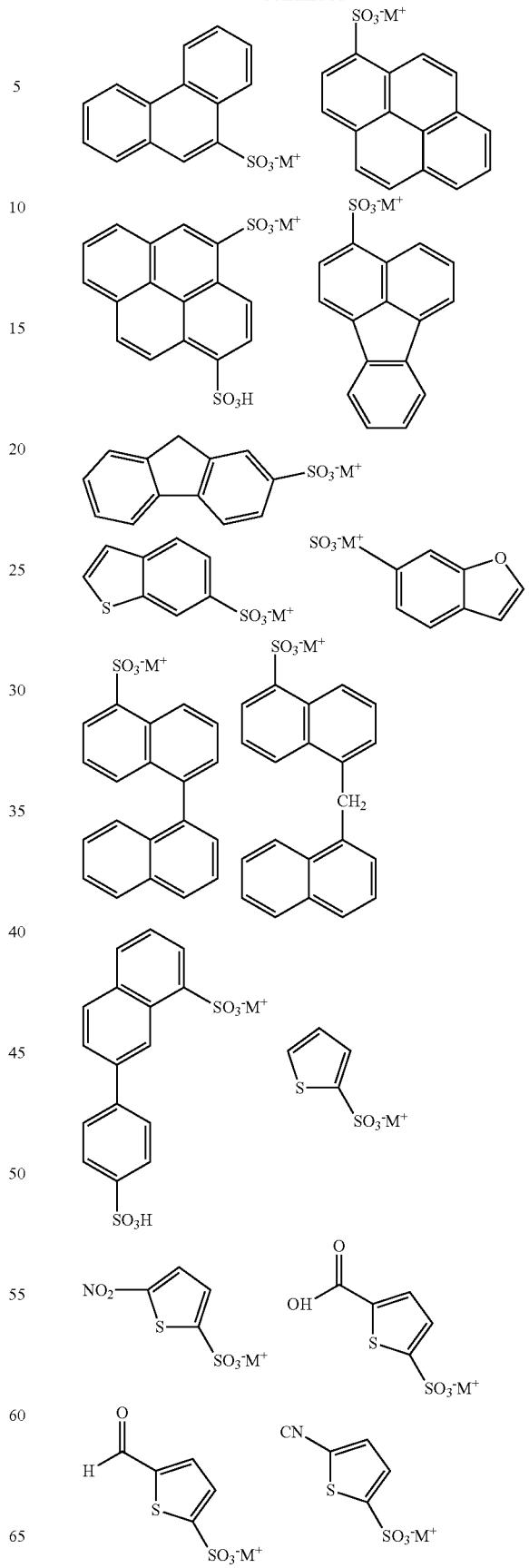

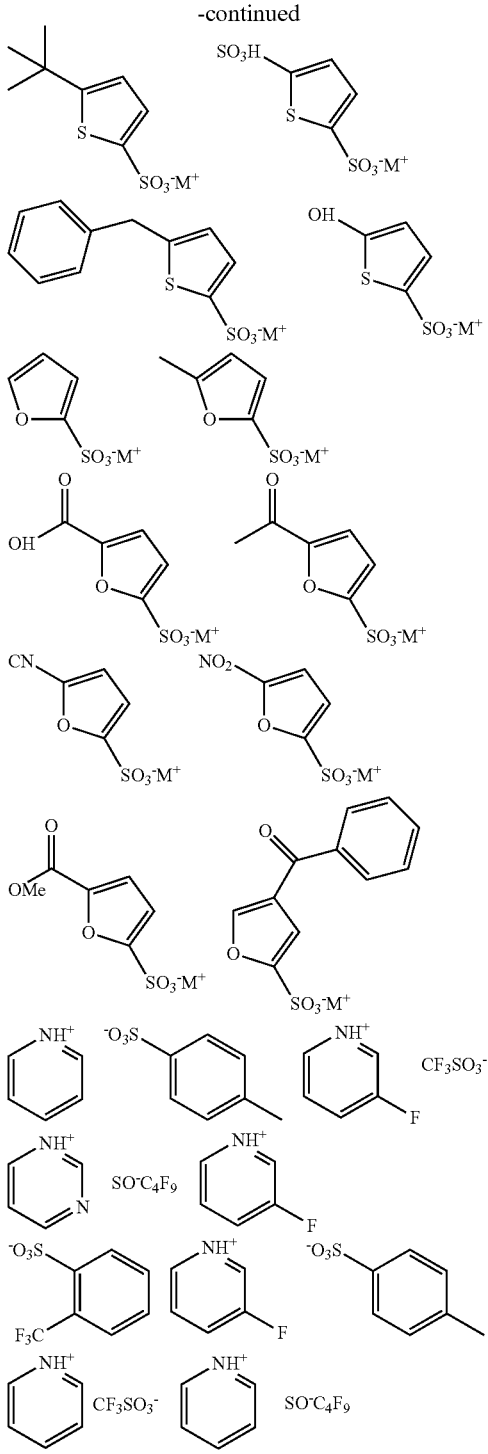

wherein M+ is an organic cation. The one or more acid generator is typically present in the compositions in an amount of from 0.01 to 20 wt %, more typically from 0.1 to 10 wt % or from 1 to 5 wt %, based on total solids of the trimming composition.

The descumming compositions further include a solvent or solvent mixture. Suitable solvent materials to formulate and cast the descumming compositions exhibit very good solubility characteristics with respect to the non-solvent components of the descumming composition, but do not appreciably dissolve the underlying photoresist pattern so as to minimize intermixing. The solvent is typically chosen from water, aqueous solutions, organic solvents and mixtures thereof. Suitable organic solvents for the descumming composition include, for example: alcohols such as straight, branched or cyclic $C_4$-$C_9$ monohydric alcohol such as 1-butanol, 2-butanol, isobutyl alcohol, tert-butyl alcohol, 2-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; alkyl esters such as alkyl acetates such as n-butyl acetate, propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; ethers such as isopentyl ether and dipropylene glycol monomethyl ether; and mixtures containing one or more of these solvents. Of these organic solvents, alcohols, aliphatic hydrocarbons and ethers are preferred. The solvent component of the descumming composition is typically present in an amount of from 90 to 99 wt % based on the total weight of the descumming composition.

The descumming compositions may include optional additives and are preferably free of cross-linking agents as such materials can result in a dimensional increase of the resist pattern and may interfere with scum removal. As an optional additive, the descumming compositions can include a component that reacts with scum on the substrate, rendering the scum soluble in an organic solvent rinsing agent. This optional component preferably contains functional groups chosen from —OH, —NH, —SH, ketones, aldehydes, —SiX wherein X is a halogen, vinyl ethers and combinations thereof. Without wishing to be bound by any particular theory, it is believed that the component diffuses into the scum and reacts with carboxylic acid groups of the scum. This reaction results in a polarity change of the surface, rendering the surface soluble in the organic solvent. This component can be useful, for example, where the photoresist pattern is formed by negative tone development (NTD) wherein the pattern is composed of unexposed portions of the photoresist comprising acid-labile groups. Such component if used is typically present in an amount of from 0.1 to 10 wt % based on total solids of the descumming composition.

The descumming composition can further include a surfactant. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable nonionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO copolymers PLURONIC® 25R2, L121, L123, L31, L81, L101 and P123 (BASF, Inc.). Such surfactant and other optional additives if used are typically present in the composition in minor amounts such as from 0.01 to 10 wt % based on total solids of the descumming composition.

The descumming compositions can be prepared following known procedures. For example, the compositions can be prepared by dissolving solid components of the composition in the solvent components. The desired total solids content of the compositions will depend on factors such as the desired final layer thickness. Preferably, the solids content of the descumming compositions is from 1 to 10 wt %, more preferably from 1 to 5 wt %, based on the total weight of the composition.

Processes in accordance with the invention will now be described with reference to FIG. 1A-F, which illustrates an exemplary process flow for forming an ion implanted region in a semiconductor device using a photoresist descumming composition as described herein. FIG. 1A depicts in cross-section a semiconductor substrate 100. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. Layers forming part of the substrate may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, or electroplating.

Ion implanted regions are typically formed a number of times through the semiconductor manufacturing process. The regions to be ion implanted may be present in the base substrate material itself or in a layer formed over the base substrate material. Typical ion implanted regions include, for example, wells, source/drain regions, transistor channel regions, lightly doped drains (LDDs), device isolation regions, contact holes implant regions and the like.

A photoresist layer 102 formed from a chemically amplified photosensitive composition comprising a matrix polymer having acid labile groups is coated over the substrate. The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 102 is from about 500 to 3000 Å.

The photoresist layer 102 can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

It may be desired to dispose over the substrate an antireflective coating above or beneath the photoresist layer to be coated to reduce reflection of incident radiation during photoresist exposure. Such coatings can improve depth-of-focus, exposure latitude, linewidth uniformity and CD control. Because integrity of the ion implantation process depends to a large extent on the quality of the surface being implanted, it is preferable that the implanted surface be free of damage that can occur when an inorganic bottom antireflective coating (BARC) material is plasma-etched following photoresist development. As such, it is preferable to use an organic developable BARC (DBARC) layer beneath the photoresist pattern and/or a top antireflective coating (TARC) layer over the photoresist pattern when an antireflective material is desired. These materials are advantageous in that they can be removed from the substrate without exposing the regions of the substrate to be ion implanted to plasma etch-induced damage during etching. Such materials can be removed from the substrate at the time of developing the photoresist layer. Because some DBARC materials are photosensitive, such a DBARC layer underlying the photoresist layer can be exposed and patterned at the same time as the photoresist layer using the same developer. Suitable DBARC materials and methods of use are known in the art and are described, for example, in U.S. Application Pub. No. US2011/0003250A1 and U.S. Pat. No. 7,824,837B2 and U.S. Pat. No. 8,088,548B2. Suitable TARC materials which are developer soluble and therefore removable at the time of resist development are also known in the art and described, for example, in U.S. Pat. No. 5,750,312.

If the photoresist layer 102 is to be exposed with an immersion lithography tool, for example a 193 nm immersion scanner, an immersion topcoat layer can be disposed over the photoresist layer. Use of such a topcoat layer can act as a barrier between the immersion fluid and underlying photoresist layer as well as providing antireflection properties. In this way, leaching of components of the photoresist composition into the immersion fluid, possibly resulting in contamination of the optical lens and change in the effective refractive index and transmission properties of the immersion fluid, can be minimized or avoided. Suitable topcoat compositions and their use are known in the art as described, for example, in U.S. Pat. No. 8,012,666B2 and U.S. Pat. No. 8,241,832B2.

The photoresist layer 102 is next exposed to activating radiation 104 through a first photomask 106 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions 108, 110 corresponding to regions of the resist layer to be exposed and unexposed, respectively, by the activating radiation. The activating radiation can, for example, have an exposure wavelength of sub-400 nm, sub-300 nm or sub-200 nm such as 193 nm or EUV wavelengths, or can take the form of e-beam radiation. The exposure energy is typically from about 10 to 80 mJ/cm², dependent upon the exposure tool and the components of the photosensitive composition.

Following exposure of the photoresist layer 102, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. A latent image defined by the boundary between polarity-switched and unswitched regions (corresponding to exposed and unexposed regions, respectively) is thereby formed. The feature geometries of the resist pattern are not limited and correspond to the geometries of the regions of the substrate to be implanted and not implanted.

The photoresist layer 102 is next developed to remove exposed regions of the layers, leaving unexposed regions forming a resist pattern 102' having a plurality of features as shown in FIG. 1B. The illustrated process is a positive tone development (PTD) method. The PTD developer is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH). Alternatively, negative tone development can be conducted by use of a suitable organic solvent developer. NTD results in the removal of unexposed regions of the photoresist layer, leaving behind exposed regions due to polarity reversal of those regions. Suitable NTD developers include, for example, a solvent chosen from ketones, esters, ethers, hydrocarbons, and mixtures thereof. Other suitable solvents include those used in the photoresist composition. The developer is preferably 2-heptanone or a butyl acetate such as n-butyl acetate.

Development of the photoresist layer can give rise to the presence of resist scum 111 on the substrate surface at the edges of resist pattern 102'. Resist scum 111 is undesirable as the dopant profile during ion implantation and resulting electrical properties of the formed devices can become altered from target values.

A layer 112 of a descumming composition as described herein is formed over the photoresist pattern 102' as shown in FIG. 1C. The descumming composition is typically applied to the substrate by spin-coating. The solids content of the descumming composition can be adjusted to provide a desired film thickness based upon the specific coating equipment utilized, the viscosity of the solution, the speed of the coating tool and the amount of time allowed for spinning. A typical thickness for the descumming composition layer 112 is from 200 to 1500 Å.

The substrate is next exposed to conditions to generate an acid in the descumming composition from the acid generator. For descumming compositions comprising a TAG, the conditions to generate an acid involve heating the composition to a temperature causing generation of the acid by the TAG. Heating of the substrate can serve to remove solvent in the descumming layer, cause acid generation by the TAG, diffuse the generated acid into the scum on the substrate and allow polarity-changing reaction in the scum. Heating of the substrate can be conducted on a hotplate or in an oven 114, with a hotplate being typical, as shown in FIG. 1D-1. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical.

As shown in FIG. 1D-2, for PAG-containing descumming compositions, the conditions involve exposure of the composition to activating radiation 116 for the particular PAG, for example, light having a particular wavelength (e.g., 365 nm, 248 nm, 193 nm or EUV wavelength). Exposure of the descumming composition is preferably performed by flood exposure so as to expose the entire descumming composition layer. Typically, the substrate is baked prior to exposure to remove solvent form the descumming composition and again following exposure to diffuse the generated acid into the scum on the substrate and allow polarity-changing reaction in the scum. Heating of the substrate can be conducted on a hotplate or in an oven, with a hotplate being typical. Suitable heating temperatures for both pre- and post-exposure bake are greater than 50° C., for example, greater than 70° C., greater than 90° C., greater than 120° C. or greater than 150° C., with a temperature of from 70 to 160° C. and a time of from about 30 to 90 seconds being typical. For compositions containing a combination of a TAG and PAG, use of heating and exposure to radiation as described above can be employed.

The substrate is next contacted with a rinsing agent to remove residual descumming composition and resist scum from the substrate. The rinsing agent is typically water, an aqueous alkaline solution, or an organic solvent or solvent mixture, and may include additional optional components such as a surfactant as described above. Suitable aqueous alkaline solutions include, for example, a quaternary ammonium hydroxide solution, for example, a tetra-alkyl ammonium hydroxide solutions such as 0.26 Normality (N) (2.38 wt %) tetramethylammonium hydroxide (TMAH). Suitable organic solvents include, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Other suitable solvents include those used in the photoresist composition.

As shown in FIG. 1E, the substrate 100 having a scum-free surface is introduced into an ion implantation tool in which an ion beam 118 is generated and brought into contact with the substrate 100. The impurities are typically n-type (e.g., phosphorus or arsenic) or p-type (e.g., boron) and present in the ion beam as ionized species generated from a source, for example, a gas source such as phosphine, arsine or boron trifluoride, or a solid source such as solid arsenic or phosphorus Impurity atoms from the ion beam are selectively introduced into the substrate 100 to form doped regions 120 in regions of the substrate not covered by the photoresist pattern 102'.

Following the ion implantation process, the photoresist pattern 102' is stripped from the surface of the substrate. Suitable techniques and chemistries for stripping the photoresist pattern 102' from the substrate are known in the art. The resist pattern can, for example, be removed by oxygen plasma with any remaining residue being removed in standard aqueous cleaning chemistries, for example, RCA (SC1+SC2) wet chemical cleaning. After removal of the resist pattern from the substrate surface, the substrate is typically subjected to thermal annealing treatment, for example, to repair damage in the substrate caused during the implant process and to activate the dopant atoms. Annealing techniques are known in the art and include heating the wafer at elevated temperature for a period of time to repair damage in the substrate caused by the implant process. Annealing is typically conducted in an inert gas atmosphere in a rapid thermal processor or a diffusion furnace. The annealing conditions will depend, for example, on the dopant material, the material into which the dopants are implanted and the desired dopant profile. The resulting structure is shown in FIG. 1F.

The following non-limiting examples are illustrative of the invention.

EXAMPLES

Photoresist Descumming Compositions

Example 1

2.153 g of a copolymer of n-butyl methacrylate/methacrylic acid (77/23 by wt.), 0.047 g 3-fluoropyridinium p-toluene sulfonate and 97.8 g 4-methyl-2-pentanol were mixed together until all components were dissolved. The resulting mixture was filtered with a 0.2 micron Nylon filter.

Example 2

2.148 g of a copolymer of n-butyl methacrylate/methacrylic acid (77/23 by wt.), 0.047 g 3-fluoropyridinium p-toluene sulfonate, 0.006 g POLYFOX PF-656 surfactant (Omnova Solutions Inc.) and 97.8 g 4-methyl-2-pentanol were mixed together until all components were dissolved. The resulting mixture was filtered with a 0.2 micron Nylon filter.

Example 3

2.145 g of copolymer of n-butyl methacrylate/methacrylic acid (77/23 by wt.), 0.055 g ammonium perfluorobutane sulfonate and 97.8 g 4-methyl-2-pentanol were mixed together until all components were dissolved. The resulting mixture was filtered with a 0.2 micron Nylon filter.

Example 4

2.153 g of polyacrylic acid, 0.047 g 3-fluoropyridinium p-toluene sulfonate and 97.8 g 4-methyl-2-pentanol are mixed together until all components are dissolved. The resulting mixture is filtered with a 0.2 micron Nylon filter.

Example 5

2.153 g of polyvinyl alcohol, 0.047 g 3-fluoropyridinium p-toluene sulfonate and 97.8 g 4-methyl-2-pentanol are mixed together until all components are dissolved. The resulting mixture is filtered with a 0.2 micron Nylon filter.

Example 6

2.153 g of Polyvinylpyrrolidone, 0.047 g 3-fluoropyridinium p-toluene sulfonate and 97.8 g 4-methyl-2-pentanol are mixed together until all components are dissolved. The resulting mixture is filtered with a 0.2 micron Nylon filter.

Example 7

2.153 g of a copolymer of Formula (P-1) (a/b=90/10 by wt.), 0.047 g 3-fluoropyridinium p-toluene sulfonate and 97.8 g 4-methyl-2-pentanol are mixed together until all components are dissolved. The resulting mixture is filtered with a 0.2 micron Nylon filter.

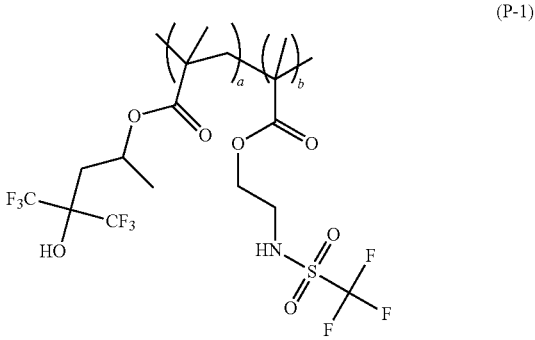

(P-1)

Example 8

2.157 g of a copolymer of n-butyl methacrylate/methacrylic acid (77/23 by wt.), 0.043 g 3-fluoropyridinium triflate and 97.8 g 4-methyl-2-pentanol are mixed together until all components are dissolved. The resulting mixture is filtered with a 0.2 micron Nylon filter.

Example 9

2.114 g of a copolymer of n-butyl methacrylate/methacrylic acid (77/23 by wt.), 0.086 g 3-fluoropyridinium perfluorobutane sulfonate and 97.8 g 4-methyl-2-pentanol are mixed together until all components are dissolved. The resulting mixture is filtered with a 0.2 micron Nylon filter.

Example 10

2.143 g of a copolymer of n-butyl methacrylate/methacrylic acid (77/23 by wt.), 0.057 g 3-fluoropyridinium camphor sulfonate and 97.8 g 4-methyl-2-pentanol are mixed together until all components are dissolved. The resulting mixture is filtered with a 0.2 micron Nylon filter.

Example 11

2.153 g of a copolymer of n-butyl methacrylate/methacrylic acid (77/23 by wt.), 0.047 g 3-fluoropyridinium trifluorobenzene sulfonate and 97.8 g 4-methyl-2-pentanol are mixed together until all components are dissolved. The resulting mixture is filtered with a 0.2 micron Nylon filter.

Example 12

2.113 g of a copolymer of n-butyl methacrylate/methacrylic acid (77/23 by wt.), 0.087 g thermal acid generator (TAG-1) and 97.8 g 4-methyl-2-pentanol are mixed together until all components are dissolved. The resulting mixture is filtered with a 0.2 micron Nylon filter.

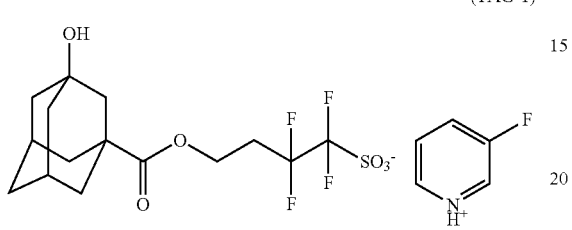

(TAG-1)

Example 13

2.159 g of a copolymer of n-butyl methacrylate/methacrylic acid (77/23 by wt.), 0.041 g pyridinium p-toluene sulfonate and 97.8 g 4-methyl-2-pentanol are mixed together until all components are dissolved. The resulting mixture is filtered with a 0.2 micron Nylon filter.

Example 14

2.173 g of a copolymer of n-butyl methacrylate/methacrylic acid (77/23 by wt.), 0.027 g Ammonium p-toluene sulfonate and 97.8 g 4-methyl-2-pentanol are mixed together until all components are dissolved. The resulting mixture is filtered with a 0.2 micron Nylon filter.

Example 15

2.173 g of polyacrylic acid, 0.027 g Ammonium p-toluene sulfonate and 97.8 g water are mixed together until all components are dissolved. The resulting mixture is filtered with a 0.2 micron Nylon filter.

Example 16

2.131 g of a copolymer of n-butyl methacrylate/methacrylic acid (77/23 by wt.), 0.069 g thermal acid generator (TAG-2) and 97.8 g 4-methyl-2-pentanol are mixed together until all components are dissolved. The resulting mixture is filtered with a 0.2 micron Nylon filter.

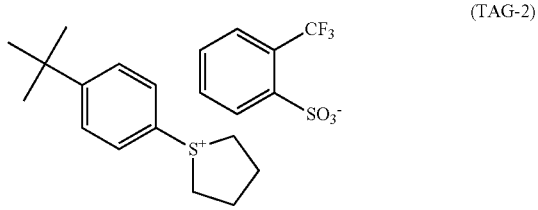

(TAG-2)

Example 17

2.110 g of a copolymer of n-butyl methacrylate/methacrylic acid (77/23 by wt.), 0.090 g photoacid generator (PAG-1) and 97.8 g 4-methyl-2-pentanol are mixed together until all components are dissolved. The resulting mixture is filtered with a 0.2 micron Nylon filter.

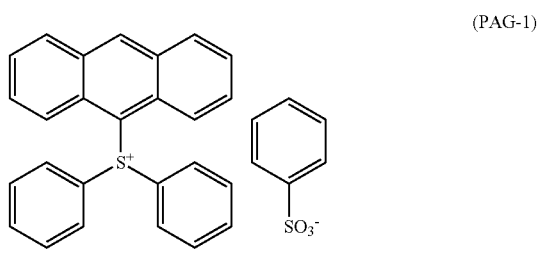

(PAG-1)

Example 18

2.131 g of a copolymer of n-butyl methacrylate/methacrylic acid (77/23 by wt.), 0.069 g photoacid generator (PAG-2) and 97.8 g 4-methyl-2-pentanol are mixed together until all components are dissolved. The resulting mixture is filtered with a 0.2 micron Nylon filter.

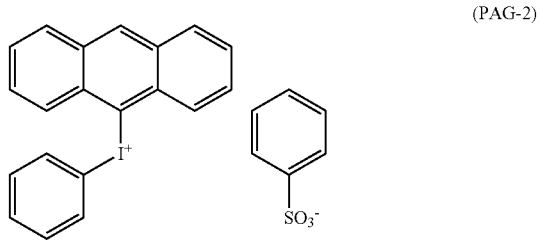

(PAG-2)

Example 19

2.140 g of a copolymer of n-butyl methacrylate/methacrylic acid (77/23 by wt.), 0.060 g photoacid generator (PAG-3) and 97.8 g 4-methyl-2-pentanol are mixed together until all components are dissolved. The resulting mixture is filtered with a 0.2 micron Nylon filter.

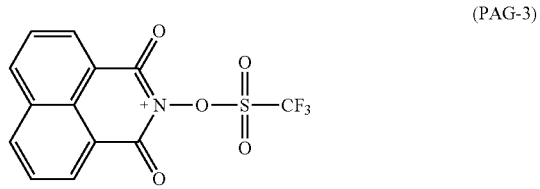

(PAG-3)

Lithographic Processing

Example 20

Comparative

EPIC 2096 ArF photoresist (Rohm and Haas Electronic Materials LLC, Marlborough, Mass.) was spin-coated over organic bottom antireflective coating (BARC) bilayer (AR™137 20 nm/AR™26N 76 nm) coated 12-inch silicon wafers on a TEL Clean Track Lithius i+(Tel Clean Track) and the wafers were softbaked (SB) at 120° C. for 60 seconds. A 30 nm thick OC™2000 topcoat layer (Rohm and Haas Electronic Materials) was applied over the photoresist layer on a TEL Clean Track and baked at 90° C. for 60 seconds. The coated wafers were exposed on an ASML ArF 1900i with NA=1.35, Dipole 35Y illumination (0.9/0.76 sigma), plus x polarization, and then post-exposure baked (PEB) at 95° C. for 60 seconds. The coated wafers were treated with a 0.26N (normal) aqueous TMAH solution for 12 seconds with a Tel Lithus GP nozzle to form 140 nm 1:1 trenches. Critical dimension (CD) measurements for the 140 nm trenches were made on a Hitachi CG 4000 SEM, and the presence and relative amount of scum was visually examined using images produced with the SEM at 20 mJ/cm$^2$. The relative amount of observed scum was categorized on a scale from least to greatest as follows: no scum (absence of visually detected scum) <slight scum<moderate scum<heavy scum. The presence of heavy scum was observed on the formed resist-patterned wafer.

Examples 21-23

A 600 Å thick layer of the descumming composition of Example 1 was spin-coated over a patterned wafer formed in Example 20 using a TEL Clean Track. The wafer was baked at 70° C. for 60 seconds, rinsed in a 2.38% TMAH developer rinsing agent for 30 seconds and rinsed with water, on the Clean Track. Critical dimension (CD) measurements for the 140 nm trenches were made on a Hitachi CG 4000 SEM and the presence and amount of scum was examined at 20 mJ/cm$^2$. This process was repeated using descumming compositions of Examples 2 and 3. The results are set forth in Table 1.

TABLE 1

| Example | Descumming Composition | CD (nm) at 20 mj/cm2 | Scum of 140 nm trench 1:1 |
| --- | --- | --- | --- |
| 20 (Comp) | — | 123 | Heavy Scum |
| 21 | Ex. 1 | 137 | No scum |
| 22 | Ex. 2 | 139 | No scum |
| 23 | Ex. 3 | 133 | Slight Scum |

Examples 24-33

The procedures of Example 21 are performed except the photoresist descumming compositions of Examples 4-13 are substituted as the descumming composition. It is expected that processing with the descumming compositions would be effective to reduce or eliminate the presence of scum on the resist-patterned wafers.

Examples 34-36

The procedures of Example 21 are performed except the photoresist descumming compositions of Examples 14-16 are substituted as the descumming composition and the wafers are baked at 135° C. for 60 seconds. It is expected that processing with the descumming compositions would be effective to reduce or eliminate the presence of scum on the resist-patterned wafers.

Examples 37-39

600 Å thick layers of descumming compositions of Example 17-19 are spin-coated over patterned wafers such as described in Example 20. The wafers are baked at 90° C. for 60 seconds, are flood exposed on an i-line (365 nm) exposure tool using 50 mJ/cm$^2$, and are again baked at 70° C. for 60 seconds. The wafers are rinsed in a 2.38% TMAH developer for 30 seconds and rinsed with water on a coater-developer tool. It is expected that processing with the descumming compositions would be effective to reduce or eliminate the presence of scum on the resist-patterned wafers.

Ion Implantation

Example 40-59

The wafers of Examples 20-39 are ion implanted with B$^{11}$ (10$^{14}$ atoms/cm$^2$, 40 keV) using a BF$_3$ source. It is expected that ion implantion dopant profiles of the wafers would be improved over that of the wafer of Example 20.

What is claimed is:
1. A method of forming an ion implanted region in a semiconductor device, comprising:
   (a) providing a semiconductor substrate having a plurality of regions to be ion implanted;
   (b) forming a photoresist pattern on the semiconductor substrate, wherein the photoresist pattern is formed from a chemically amplified photoresist composition comprising a matrix polymer having acid labile groups, a photoacid generator and a solvent;
   (c) coating a descumming composition over the photoresist pattern, wherein the descumming composition comprises: a matrix polymer that is water insoluble; an acid generator chosen from thermal acid generators, photoacid generators and combinations thereof; and a solvent;
   (d) exposing the coated semiconductor substrate to conditions to generate an acid in the descumming composition from the acid generator;
   (e) contacting the coated semiconductor substrate with a rinsing agent to remove residual descumming composition and scum from the substrate; and
   (f) ion implanting the plurality of regions of the semiconductor substrate using the photoresist pattern as an implant mask.
2. The method of claim 1, wherein the generated acid is an aromatic acid.
3. The method of claim 2, wherein the aromatic acid contains fluorine.
4. The method of claim 1, wherein the generated acid is a non-aromatic acid.
5. The method of claim 4, wherein the non-aromatic acid has at least one fluorine substituent at the alpha position of the acid group.
6. The method of claim 1, wherein the solvent of the descumming composition comprises an organic solvent.
7. The method of claim 1, wherein the descumming composition is an aqueous solution.
8. The method of claim 1, wherein the rinsing agent is an aqueous alkaline solution.
9. The method of claim 1, wherein the rinsing agent comprises an organic solvent or solvent mixture.
10. The method of claim 9, wherein the rinsing agent further comprises water.
11. The method of claim 1, wherein the matrix polymer of the descumming composition comprises functional groups chosen from —OH, —COOH, —SO$_3$H, —SiOH, hydroxyl styrene, hydroxyl naphthalene, sulfonamide, hexafluoroisopropyl alcohol, anhydrate, lactone, ester, ether, allylamine, pyrolidone and combinations thereof.

12. The method of claim 1, wherein forming the photoresist pattern comprises coating a layer of the photoresist composition over a developable bottom antireflective layer that is exposed and developed simultaneously with the photoresist pattern.

13. The method of claim 1, wherein the generated acid is a sulfonic acid.

* * * * *